United States Patent
Viswanath et al.

(10) Patent No.: US 10,151,845 B1
(45) Date of Patent: Dec. 11, 2018

(54) CONFIGURABLE ANALOG-TO-DIGITAL CONVERTER AND PROCESSING FOR PHOTON COUNTING

(71) Applicant: TEXAS INSTRUMENTS INCORPORATED, Dallas, TX (US)

(72) Inventors: Rakul Viswanath, Chennai (IN); Nagesh Surendranath, Bengaluru (IN); Goli Sravana Kumar, Bengaluru (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/667,445

(22) Filed: Aug. 2, 2017

(51) Int. Cl.
*G01T 1/24* (2006.01)

(52) U.S. Cl.
CPC .................... *G01T 1/247* (2013.01)

(58) Field of Classification Search
CPC ........................................ G01T 1/247
See application file for complete search history.

(56) References Cited

U.S. PATENT DOCUMENTS

| | | | |
|---|---|---|---|
| 4,070,578 A | 1/1978 | Timothy et al. | |
| 4,255,659 A | 3/1981 | Kaufman et al. | |
| 4,595,909 A * | 6/1986 | Jarrett | H03M 1/42 257/216 |
| 4,647,903 A * | 3/1987 | Ryu | H03M 1/462 341/136 |
| 5,508,507 A | 4/1996 | Nelson et al. | |
| 5,693,946 A | 12/1997 | Vickers et al. | |
| 5,943,388 A | 8/1999 | Turner | |
| 6,300,635 B1 | 10/2001 | Brambilla et al. | |
| 6,324,244 B1 | 11/2001 | Lauter et al. | |
| 6,678,039 B2 | 1/2004 | Charbon | |
| 6,781,134 B1 | 8/2004 | Murray | |
| 6,917,041 B2 | 7/2005 | Doty et al. | |
| 6,998,913 B2 | 2/2006 | DeGeronimo | |
| 7,065,175 B2 | 6/2006 | Green | |
| 7,139,024 B2 | 11/2006 | Lu et al. | |
| 7,157,715 B1 | 1/2007 | Craing, Jr. et al. | |
| 7,157,716 B2 | 1/2007 | Kitaguchi et al. | |
| 7,170,049 B2 | 1/2007 | Iwanczyk et al. | |
| 7,233,979 B2 | 6/2007 | Dickerman et al. | |
| 7,250,896 B1 * | 7/2007 | Hesener | H03M 1/144 341/144 |
| 7,339,175 B1 | 3/2008 | Drummond et al. | |
| 7,362,175 B2 | 4/2008 | Argues | |
| 7,368,722 B2 | 5/2008 | Berthold et al. | |
| 7,388,210 B2 | 6/2008 | Ouvrier-Buffet et al. | |
| 7,514,688 B2 | 4/2009 | Boroennimann et al. | |

(Continued)

*Primary Examiner* — Mark R Gaworecki
(74) *Attorney, Agent, or Firm* — John R. Pessetto; Charles A. Brill; Frank D. Cimino

(57) ABSTRACT

A photon counting system includes a photon sensor, a charge-sensitive amplifier (CSA) and an analog-to-digital converter (ADC). The CSA is configured to convert photon energy detected by the photon sensor to voltage pulses. The ADC is configured to digitize the voltage pulses generated by the CSA. The ADC includes successive approximation circuitry. The successive approximation circuitry includes an N-bit digital-to-analog converter (DAC), an N-bit successive approximation register (SAR), a plurality of N-bit registers, and a multiplexer configured to selectively route outputs of the SAR and outputs of the N-bit registers to the DAC for conversion to an analog signal.

20 Claims, 4 Drawing Sheets

(56) References Cited

U.S. PATENT DOCUMENTS

| | | |
|---|---|---|
| 7,528,375 B2 | 5/2009 | Matsumoto |
| 7,582,878 B2 | 9/2009 | Shahar et al. |
| 7,592,603 B2 | 9/2009 | Hsi et al. |
| 7,615,753 B2 | 11/2009 | Audebert et al. |
| 7,615,755 B2 | 11/2009 | Coello et al. |
| 7,634,061 B1 | 12/2009 | Turner et al. |
| 7,738,631 B2 | 6/2010 | Rundle |
| 7,760,123 B2 | 7/2010 | Rao et al. |
| 7,818,047 B2 | 10/2010 | Tumer et al. |
| 7,868,665 B2 | 1/2011 | Tumer et al. |
| 8,044,681 B2 | 10/2011 | Rao et al. |
| 8,159,286 B2 | 4/2012 | Rao et al. |
| 8,170,175 B2 | 5/2012 | Kasuya |
| 8,198,577 B2 | 6/2012 | Dierickx |
| 8,213,566 B2 | 7/2012 | Roessl et al. |
| 8,258,480 B2 | 9/2012 | Olcott et al. |
| 8,260,565 B2 | 9/2012 | DeGeronimo |
| 8,269,180 B2 | 9/2012 | DeGeronimo |
| 8,299,670 B2 | 10/2012 | Krumme |
| 8,338,773 B2 | 12/2012 | Eldesouki et al. |
| 8,373,135 B2 | 2/2013 | Kappler |
| 8,378,310 B2 | 2/2013 | Bornefalk et al. |
| 8,384,038 B2 | 2/2013 | Guo et al. |
| 8,415,635 B2 | 4/2013 | Marks et al. |
| 8,426,828 B2 | 4/2013 | Dierickx |
| 8,440,957 B2 | 5/2013 | Dierickx |
| 8,491,190 B2 | 7/2013 | Glasser et al. |
| 8,530,850 B2 | 9/2013 | Spartiotis et al. |
| 8,610,081 B2 | 12/2013 | Rao et al. |
| 8,618,495 B2 | 12/2013 | DeGeronimo |
| 8,680,474 B2 | 3/2014 | Soh et al. |
| 8,692,176 B2 | 4/2014 | Kelly et al. |
| 8,716,643 B2 | 5/2014 | Eldesouki et al. |
| 8,729,485 B2 | 5/2014 | Soh et al. |
| 8,748,832 B2 | 6/2014 | Brambilla et al. |
| 8,766,198 B2 | 7/2014 | Dinapoli et al. |
| 8,772,730 B2 | 7/2014 | Han et al. |
| 8,816,290 B2 | 8/2014 | Hamlin |
| 8,816,292 B2 | 8/2014 | Cui et al. |
| 8,859,944 B2 | 10/2014 | Eldesouki et al. |
| 8,866,094 B2 | 10/2014 | Tsukiyama et al. |
| 8,866,097 B2 | 10/2014 | Meng |
| 8,866,662 B1 * | 10/2014 | Naumov ........... H03M 1/62 341/155 |
| 8,891,845 B2 | 11/2014 | Ogawa et al. |
| 8,988,267 B1 | 3/2015 | Kimura et al. |
| 9,014,455 B2 | 4/2015 | Oh et al. |
| 9,029,793 B2 | 5/2015 | Spartiotis et al. |
| 9,081,103 B2 | 7/2015 | Loeliger et al. |
| 9,086,494 B2 | 7/2015 | Han et al. |
| 9,116,249 B1 | 8/2015 | Claus et al. |
| 9,121,955 B2 | 9/2015 | Schmitt et al. |
| 9,128,195 B2 | 9/2015 | Soh et al. |
| 9,185,314 B2 | 11/2015 | Mantri et al. |
| 9,213,108 B2 | 12/2015 | Nagai |
| 9,239,391 B2 | 1/2016 | Han et al. |
| 9,254,113 B2 | 2/2016 | Kim et al. |
| 9,274,235 B2 | 3/2016 | Kang et al. |
| 9,297,912 B2 | 3/2016 | Campbell et al. |
| 9,310,495 B2 | 4/2016 | Spartiotis et al. |
| 9,301,378 B2 | 5/2016 | Booker et al. |
| 9,351,701 B2 | 5/2016 | Yamakawa et al. |
| 9,354,331 B2 | 5/2016 | Sagoh et al. |
| 9,417,339 B2 | 8/2016 | Spahn |
| 9,437,771 B2 | 9/2016 | Deptuch |
| 9,444,344 B2 | 9/2016 | Kim et al. |
| 9,517,045 B2 | 12/2016 | Kang et al. |
| 9,538,107 B2 | 1/2017 | Chappo |
| 9,588,238 B2 | 3/2017 | Kim et al. |
| 9,588,239 B2 | 3/2017 | Abraham et al. |
| 9,595,101 B2 | 3/2017 | Kato et al. |
| 9,599,730 B2 | 3/2017 | Spahn |
| 9,602,747 B2 | 3/2017 | Scott et al. |
| 9,664,797 B2 | 5/2017 | Roessl et al. |
| 9,664,798 B2 | 5/2017 | Kappler et al. |
| 9,678,220 B2 | 6/2017 | Herrmann |
| 9,696,432 B2 | 7/2017 | Ouvrier-Buffet |
| 9,700,268 B2 | 7/2017 | Kang et al. |
| 9,702,758 B2 | 7/2017 | Nouri |
| 9,730,665 B2 | 8/2017 | Choi et al. |
| 9,736,398 B2 | 8/2017 | Kim et al. |
| 9,750,471 B2 | 9/2017 | Schirra et al. |
| 9,753,160 B2 | 9/2017 | Bellazzini |
| 9,759,822 B2 | 9/2017 | Daerr et al. |
| 9,806,552 B2 | 10/2017 | Brannick et al. |
| 9,952,333 B2 | 4/2018 | Abraham et al. |
| 9,958,557 B2 | 5/2018 | Kim et al. |
| 2008/0186214 A1 * | 8/2008 | Janakiraman ....... H03M 1/0809 341/110 |
| 2009/0046181 A1 * | 2/2009 | Olsen .................. H04N 3/155 348/265 |
| 2013/0076554 A1 * | 3/2013 | Chu ..................... H03M 1/14 341/172 |
| 2013/0106629 A1 * | 5/2013 | Nys ..................... H03M 1/144 341/110 |
| 2014/0232582 A1 * | 8/2014 | Lian .................... H03M 1/1225 341/158 |
| 2015/0146055 A1 * | 5/2015 | Sampath ............... H03M 1/442 348/294 |
| 2016/0079994 A1 * | 3/2016 | Lee ..................... H03M 1/002 341/118 |
| 2017/0119325 A1 | 5/2017 | Tamura |
| 2017/0160129 A1 | 6/2017 | Viswanath et al. |
| 2018/0049707 A1 | 2/2018 | Ishitsu et al. |

* cited by examiner

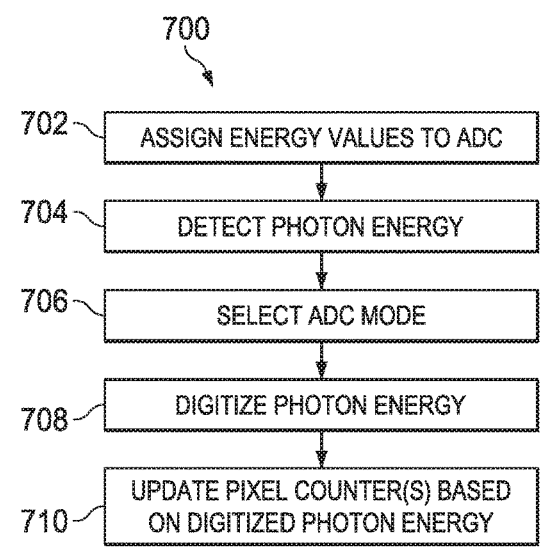

US 10,151,845 B1

CONFIGURABLE ANALOG-TO-DIGITAL CONVERTER AND PROCESSING FOR PHOTON COUNTING

BACKGROUND

The penetrative ability of X-rays makes them valuable for structural imaging applications ranging from medical imaging and materials research to quality control and security. Transmission imaging with X-rays is typically used to produce an attenuation contrast image of the material of interest. However, these images suffer from poor contrast sensitivity that poses severe limitations in many applications. X-ray systems that employ photon counting detectors provide a number of advantages over older X-ray technologies that employ energy integrating detectors. For example, using a photon counting detector applying multiple detector energy thresholds, multiple contrast media can be simultaneously imaged and are distinguishable. Accordingly, X-ray systems using photon counting detectors show promise in a variety of innovative clinical applications.

SUMMARY

A photon counting detector and an analog-to-digital converter (ADC) for use in the detector are disclosed herein. In one embodiment, a photon counting system includes a photon sensor, a charge sensitive amplifier (CSA) and an ADC. The CSA is configured to convert photon energy detected by the photon sensor to voltage pulses. The ADC is configured to digitize the voltage pulses generated by the CSA. The ADC includes successive approximation circuitry. The successive approximation circuitry includes an N-bit digital-to-analog converter (DAC), an N-bit successive approximation register (SAR), a plurality (M) of N-bit registers, and a multiplexer configured to selectively route outputs of the SAR and outputs of the N-bit registers to the DAC for conversion to an analog signal.

In another embodiment, an ADC includes successive approximation circuitry. The successive approximation circuitry includes an N-bit DAC, an N-bit SAR, a plurality (M) of N-bit registers, and a multiplexer configured to selectively route outputs of the SAR and outputs of the N-bit registers to the DAC for conversion to an analog signal.

In a further embodiment, a method for photon counting includes detecting energy of photons incident on a photon sensor. Energy values are assigned to each of a plurality (M) of N-bit registers of the ADC. Each of the energy values corresponds to an energy bin for accumulating a photon count. The detected energy is digitized by an ADC. Digitizing the detected energy includes applying successive approximation to digitize the detected energy in a first mode of the ADC. In a second mode of the ADC the digitizing includes: selectively converting the energy values stored in the N-bit registers to an analog signal, and successively comparing the analog signals to the detected energy to determine which of the energy values corresponds to the detected energy.

BRIEF DESCRIPTION OF THE DRAWINGS

For a detailed description of various examples, reference will now be made to the accompanying drawings in which:

FIG. 6A shows photon energy detected by an array of pixels of a photon sensor;

FIG. 6B shows updating of the energy bins associated with the array of pixels responsive the detected photon energy without application of anti-charge sharing;

FIG. 6C shows updating of the energy bins associated with the array of pixels responsive the detected photon energy with application of anti-charge sharing while the ADC is operating in energy threshold mode in accordance with various embodiments;

FIG. 6D shows updating of the energy bins associated with the array of pixels responsive the detected photon energy with application of anti-charge sharing while the ADC is operating in successive approximation mode in accordance with various embodiments; and FIG. 7 shows a flow diagram for a method 700 for photon counting in accordance with various embodiments.

DETAILED DESCRIPTION

Figure 1:
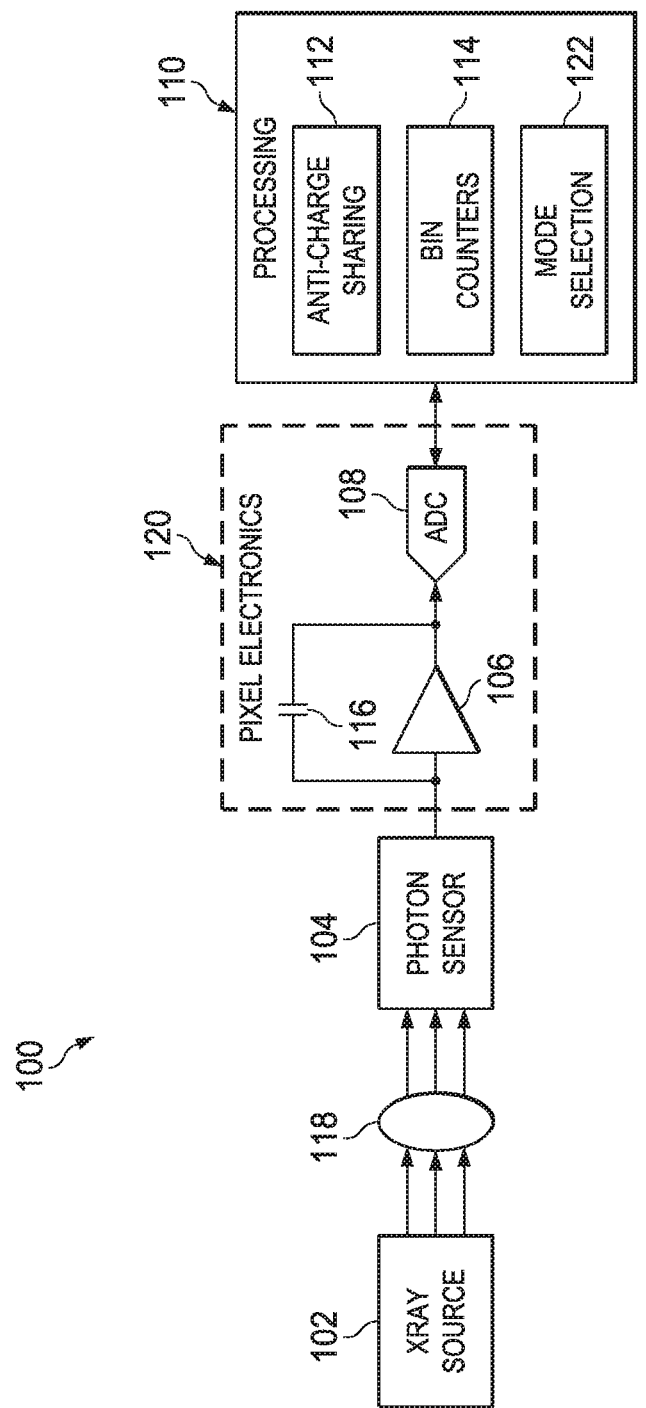
FIG. 1 shows a block diagram of a photon counting X-ray system in accordance with various embodiments.

Certain terms are used throughout the following description and claims to refer to particular system components. As one skilled in the art will appreciate, different companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct wired or wireless connection. Thus, if a first device couples to a second device, that connection may be through a direct connection or through an indirect connection via other devices and connections. The recitation "based on" is intended to mean "based at least in part on." Therefore, if X is based on Y, X may be a function of Y and any number of additional factors.

While photon counting systems provide a number of advantages over energy integrating systems, photon counting systems are subject to a variety of issues. For example, charge-sharing among multiple pixels of a photon detector due to electron cloud spread is a serious concern in photon counting systems. Countering charge-sharing with good accuracy using conventional techniques requires relatively higher power and/or an increase in circuit area. For example, conventional photon counting systems include an analog circuit for each detector pixel that resolves charge sharing by analog summation of signals corresponding to a number of adjacent pixels. Such a solution requires complex circuitry that occupies a substantial area.

Embodiments of the photon counting system disclosed herein analyze charge sharing in the digital domain rather than the analog domain. To facilitate implementation of anti-charge sharing in the digital domain, embodiments include a multi-mode ADC that digitizes the signal generated at each pixel of the photon detector. The ADC includes two operational modes. The first operational mode is successive approximation. The second operational mode is similar to successive approximation, but rather than resolving an analog signal value to each of a number of bits of a digital value as in successive approximation, the second operational mode resolves the analog signal value to one of several (e.g., fewer than eight) energy bins based on energy threshold values assigned to the ADC. In the second operational mode the conversion rate of the ADC is significantly faster and/or consumes significantly lower power than in the first operational mode.

The photon counting system selects the ADC operational mode based on the input flux rate associated with an area imaged. For example, a total photon count for an area previously imaged determines whether a pixel is in a high intensity (high flux) area or a low intensity (low flux) area. If a pixel is in a high intensity area, then the second operational mode is used to provide a higher conversion rate, and if the pixel is in a low intensity area, then the first operational mode is used to provide higher energy measurement accuracy. Embodiments further include anti-charge sharing logic that adapts to the operational mode of the ADC with respect to each pixel. For example, the anti-charge sharing logic applies a summation anti-charge sharing technique suitable for use with the digitized pixel signal values produced by the first ADC operational mode, and applies a prioritization anti-charge sharing technique suitable for use with the energy bin values produced by the second ADC operational mode.

FIG. 1 shows a block diagram of a photon counting X-ray system 100 in accordance with various embodiments. The system 100 includes an X-ray source 102, a photon sensor 104, a charge sensitive amplifier 106, an ADC 108, and processing circuitry 110. The X-ray source 102 is a clinical X-ray source, such as an X-ray tube suitable for clinical use (e.g., a clinical X-ray tube). The X-ray source 102 may emit monochromatic or polychromatic X-rays. The X-ray source 102 generates an X-ray beam that illuminates the object 118 to be imaged. While the object 118 is not part of the system 100, the object 118 is included in FIG. 1 to provide context.

The X-rays that pass through the object 118 are detected by the photon sensor 104. The photon sensor 104 is a pixelated device that senses collisions of photons across a face of the device. For example, the photon sensor 104 includes a two-dimensional array of photon sensing pixels. Each pixel of the sensor 104 is coupled to pixel electronics 120 and transfers charge induced by photon collisions to the pixel electronics 120. The pixel electronics 120 includes a charge sensitive amplifier 106 that accumulates charge transferred from the photon sensor 104 on a capacitor 116. The pixel electronics 120 may include other components that are not shown in FIG. 1. For example, the pixel electronics 120 may include circuitry to discharge the capacitor 116 in preparation for charge accumulation, circuitry to control the time over which charge is accumulated on the capacitor 116, circuitry to control the triggering of the ADC 108 (e.g., based on amplitude of output of the charge sensitive amplifier 106, or time of charge accumulation), and other circuits and components. While only a single instance of the pixel electronics 120 is shown in FIG. 1, in practice embodiments of the system 100 include as many instances of the pixel electronics as there are pixels in the photon sensor 104.

The ADC 108 is coupled to the charge sensitive amplifier 106. The charge accumulated on the capacitor 116 (i.e., the output signal of the charge sensitive amplifier 106) is digitized by the ADC 108. The ADC 108 includes selectable operational modes that allow for optimization of conversion speed and accuracy. In a first operational mode, the ADC 108 operates as a successive approximation converter to provide high accuracy measurement of the signal received from the charge sensitive amplifier 106. In a second operational mode, the ADC 108 compares the signal received from the charge sensitive amplifier 106 to a plurality of threshold values to determine which of a plurality of amplitude ranges the signal occupies. The second operational mode produces a digital output value in substantially less time than the first operational mode. The digital output of the ADC 108 is provided to the processing circuitry 110.

The processing circuitry 110 assigns each digital output value received from the ADC 108 to an energy bin. The processing circuitry 110 includes bin counters 114, anti-charge sharing logic 112, and mode selection logic 122. Each bin corresponds to a different energy range of photons sensed by a pixel, and each bin counter 114 corresponds to a number of photons detected at a given pixel that are within the energy range corresponding to the bin. For example, for each pixel of the photon sensor 104, the bin counters 114 include a counter for each of a plurality of energy ranges. The anti-charge sharing logic 112 determines which of the bin counter 114 should be updated responsive to a digitized photon energy value received from the ADC 108 and those from neighbouring pixels.

The mode selection logic 122 determines the operational mode of the ADC 108. In some embodiments, the operation mode is determined based on the input flux rate associated with an area imaged. Thus, the mode selection logic 122 tracks the frequency of photon incidence with each pixel over time to determine the appropriate operational mode for the ADC 108. For example, a total photon count for an area imaged determines whether a pixel is in a high intensity (high flux) area or a low intensity (low flux) area. If a pixel is in a high intensity area (e.g., an area having a high frequency of photon incidence), then the mode selection logic 122 selects the second operational mode of the ADC 108 to provide a higher conversion rate, and if the pixel is in a low intensity area (e.g., an area having a low frequency of photon incidence), then the mode selection logic 122 selects the first operational mode of the ADC 108 to provide higher energy measurement accuracy.

In some embodiments, the processing circuitry 110 may include a processor, such as a general-purpose microprocessor, a digital signal processor, a microcontroller, or other instruction execution device, and instructions executable by the processor to provide the mode selection logic 122, the anti-charge sharing logic 112, and update the bin counters 114. In some embodiments, the processing circuitry 110 may include hardware circuitry dedicated to the anti-charge sharing logic 112 and the bin counters 114.

Figure 2:
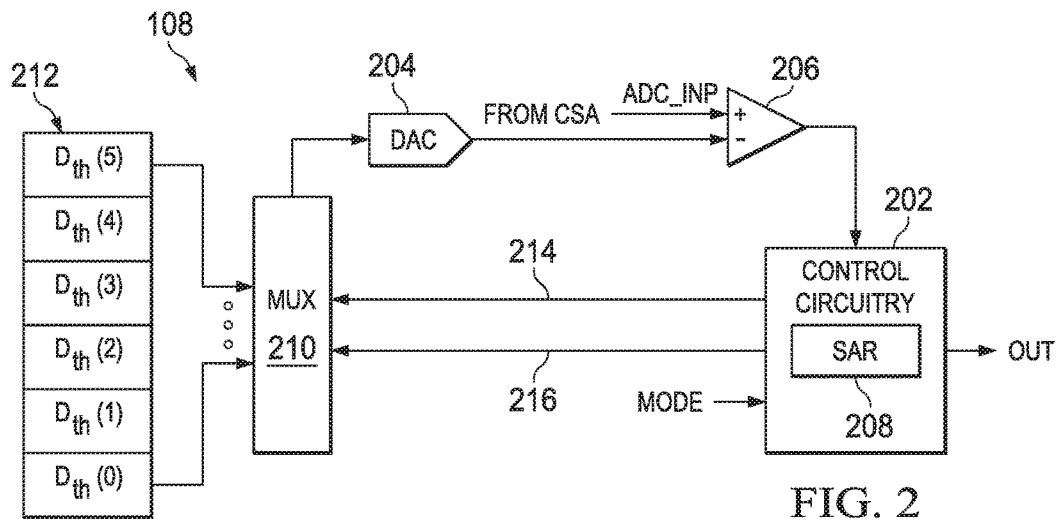
FIG. 2 shows a block diagram of a multi-mode analog-to digital converter (ADC) suitable for use in a photon counting X-ray system in accordance with various embodiments.

FIG. 2 shows a block diagram of the multi-mode ADC 108 suitable for use in a photon counting X-ray system 100 in accordance with various embodiments. The ADC 108 includes control circuitry 202, a digital to analog converter (DAC) 204, a comparator 206, a successive approximation register (SAR) 208, a multiplexer 210, and threshold registers 212. The control circuitry 202 manages operation of the ADC 108 in successive approximation mode and energy threshold mode. The multiplexer 210 selects a digital value from the SAR 208 or the threshold registers 212 to present to the DAC 204. The DAC 204 converts the digital value selected by the multiplexer 210 to an analog signal. The comparator 206 compares the analog signal generated by the DAC 204 to the signal output of the charge sensitive amplifier 106, and provides a result of the comparison to the control circuitry 202. The control circuitry 202 includes a successive approximation register (SAR) 208. In successive approximation mode, the SAR 208 stores the digital value routed to the DAC 204 via the multiplexer 210. In threshold comparison mode, the SAR 208 stores a digital value for selecting one of the threshold registers 212 containing a value to be routed to the DAC 204 via the multiplexer 210. The control circuitry 202 provides signals 214 to the multiplexer 210 to convey the value stored in the SAR 208 to the multiplexer 210 as a digital value to be routed to the DAC 204 in successive approximation mode. The control circuitry 202 provides signals 216 to select inputs of the multiplexer 210 to be routed to the DAC 204. In successive approximation mode, the signals 216 select the signals 214 to be routed to the DAC 204. In threshold comparison mode, the signals 216 convey the value stored in the SAR 208 to the multiplexer 210 as a digital value for selecting one of the threshold registers 212 containing a value to be routed to the DAC 204.

The DAC 204 may convert an N-bit digital value to an analog signal. Similarly, the SAR 208 may be N-bits in width, and each of the threshold registers 212 may be N-bits in width. In some embodiments, N is eight. In some embodiments, N may be different from eight.

Figure 3:
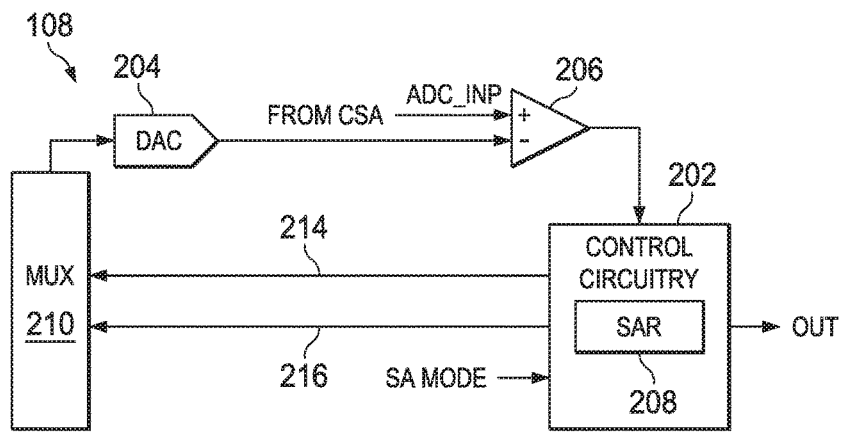
FIG. 3 shows a block diagram of the multi-mode ADC of FIG. 2 configured for successive approximation operation in accordance with various embodiments.

FIG. 3 shows a block diagram of the multi-mode ADC 108 configured for successive approximation operation in accordance with various embodiments. In successive approximation mode, the control circuitry 202 successively sets each bit of the SAR 208. The multiplexer 210 is set to route the output of the SAR 208 to the DAC 204. As each bit of the SAR 208 is set, the value of the SAR 208 is routed to the DAC 204 via the multiplexer 210 and converted to an analog signal by the DAC 204. The output of the DAC 204 is compared to the input signal received from the charge sensitive amplifier 106. Results of the comparison are provided to the control circuitry 202, and applied by the control circuitry 202 to determine whether the bit of the SAR 208 last set is to remain set or be reset. For example, if a last set bit of the SAR 208 causes the output of the DAC 204 to exceed in amplitude the input signal received from the charge sensitive amplifier 106, then the control circuitry 202 resets the last set bit. When all the bits of the SAR 208 have been sequentially set and tested, the value stored in the SAR 208 represents the digital value of the input signal received from the charge sensitive amplifier 106. Accordingly, for an N-bit SAR 208, in successive approximation mode the ADC 108 produces an N-bit value corresponding to the input signal received from the charge sensitive amplifier 106 in N cycles.

Figure 4:
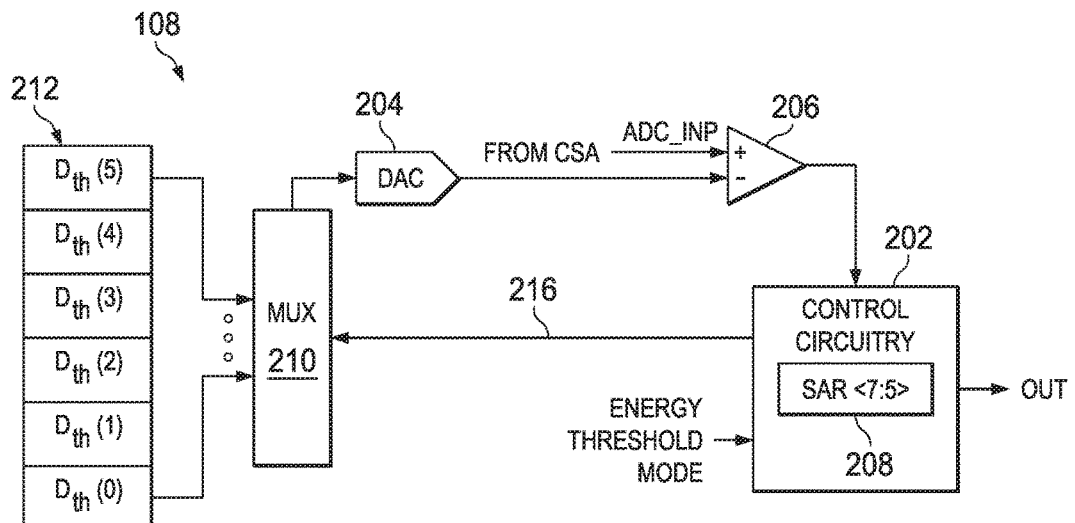
FIG. 4 shows a block diagram of the multi-mode ADC of FIG. 2 configured for energy threshold operation in accordance with various embodiments.

FIG. 4 shows a block diagram of the multi-mode ADC 108 configured for operation in energy threshold mode in accordance with various embodiments. In energy threshold mode, the threshold registers 212 contain values that correspond to photon energy ranges represented by the signal received from the charge sensitive amplifier 106. Each successive one of the threshold registers 212 may represent a higher photon energy value than the preceding threshold registers 212. For example, the energy value represented by register $D_{th}(5)$ is higher than the energy value represented by register $D_{th}(4)$. The threshold registers 212 are programmable to allow the represented energy ranges to be set as needed. In energy threshold mode, the control circuitry 202 sets an index value corresponding to one of the energy threshold registers 212 in the SAR 208. Fewer than all the bits of the SAR 208 are used. For example, for the six energy threshold registers shown in the ADC 108 of FIG. 4, only three bits of the SAR 208 are used to hold the index value. The index value stored in the SAR 208 is provided to the multiplexer 210 to select the energy threshold value to be routed to the DAC 204. For example, outputs of all of the energy threshold registers 212 are coupled to the multiplexer 210, and the multiplexer 210 selects the outputs of one of the energy threshold registers to be routed to the DAC 204. The DAC 204 converts the energy threshold value to an analog signal, and the comparator 206 compares the DAC output to the input signal received from the charge sensitive amplifier 106. Based on the output of the comparator 206, the control circuitry 202 determines which of the energy threshold values (i.e., which energy threshold register) should be presented to the DAC 204. In the ADC 108 of FIG. 4 having six energy threshold registers 212, control circuitry 202 resolves the value of the input signal received from the charge sensitive amplifier 106 in three cycles. The values stored in the threshold registers 212 correspond to pixel energy bins. Some embodiments of the ADC 108 may include a different number of energy threshold registers 212.

Figure 5:
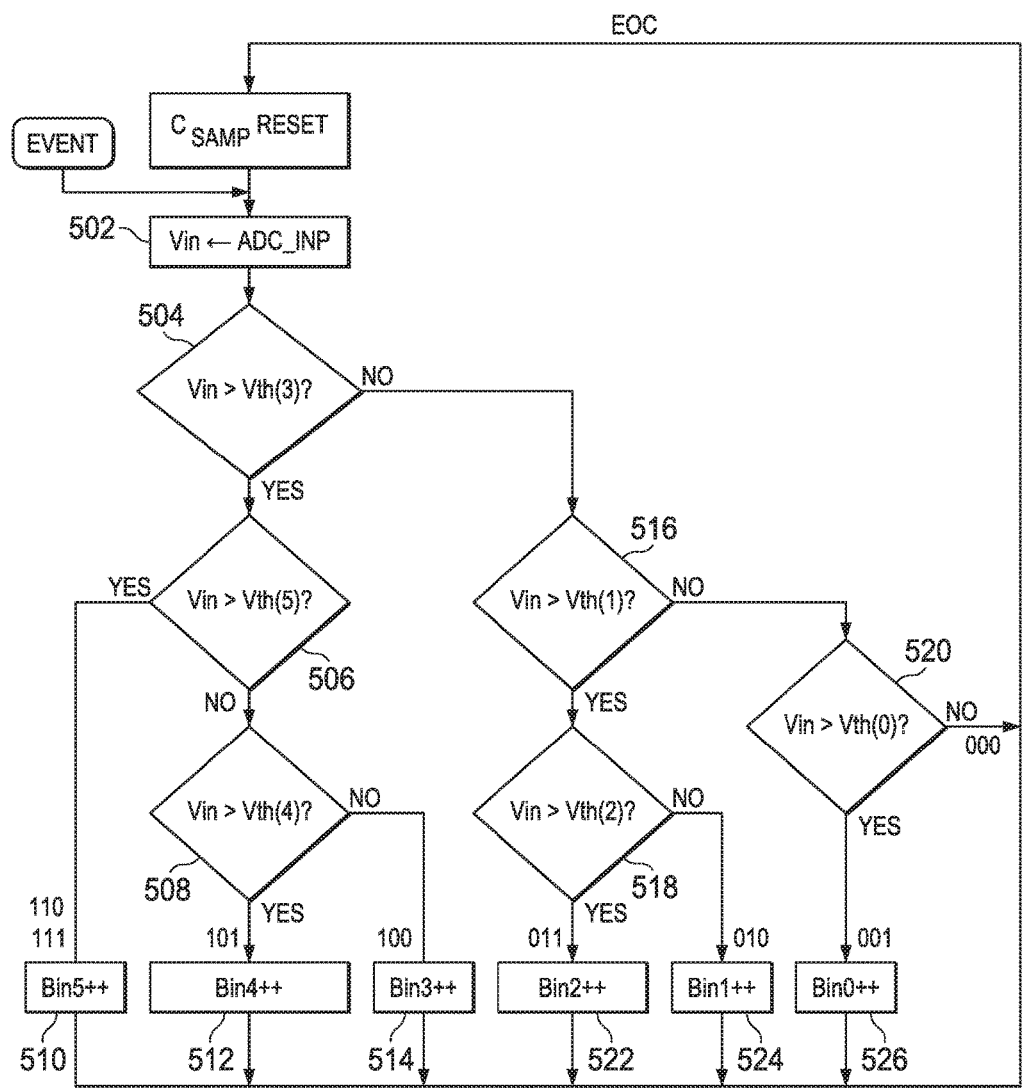
FIG. 5 shows a flow diagram for operation of the multi-mode ADC of FIG. 2 in energy threshold operation in accordance with various embodiments.

FIG. 5 shows a flow diagram for operation of the multi-mode ADC 108 in energy threshold mode in accordance with various embodiments. The flow diagram generally describes a binary search for the energy range (as defined by two energy threshold values) best corresponding to the output of the charge sensitive amplifier 106. At block 502, the ADC 108 is triggered to digitize the output of the charge sensitive amplifier 106. In block 504, the control circuitry 202 sets the index value to three (where the index value selects output of one of the threshold registers 212 to route to the DAC 204). The multiplexer 210 routes the energy threshold value stored in the threshold register 212 corresponding to the index value 3 to the DAC 204. If the output of the charge sensitive amplifier 106 is greater than the output of the DAC 204, then in block 506 the control circuitry 202 sets the index value to five, and routes the energy threshold value stored in the threshold register 212 corresponding to the index value 5 to the DAC 204.

If, in block 506, the output of the charge sensitive amplifier 106 is greater than the output of the DAC 204, then the output value of the ADC 108 is set to six. In some embodiments, a number of events corresponding to an energy bin (e.g., energy bin "5") may be incremented in block 510 (e.g., a bin counter for bin 5 may be incremented). On the other hand, if, in block 506, the output of the charge sensitive amplifier 106 is less than the output of the DAC 204, then, in block 508, the control circuitry 202 sets the index value to four, and routes the energy threshold value stored in the threshold register 212 corresponding to the index value 4 to the DAC 204.

If, in block 508, the output of the charge sensitive amplifier 106 is greater than the output of the DAC 204, then the output value of the ADC 108 is set to five. In some embodiments, a number of events corresponding to an energy bin (e.g., energy bin "4") may be incremented in block 512 (e.g., a bin counter for bin 4 may be incremented). On the other hand, if, in block 506, the output of the charge sensitive amplifier 106 is less than the output of the DAC 204, then the output value of the ADC 108 is set to four. In some embodiments, a number of events corresponding to an energy bin (e.g., energy bin "3") may be incremented in block 514 (e.g., a bin counter for bin 3 may be incremented).

If, in block 504, the output of the charge sensitive amplifier 106 is less than the output of the DAC 204, then, in block 516, the control circuitry 202 sets the index value to one, and routes the energy threshold value stored in the threshold register 212 corresponding to the index value 1 to the DAC 204. If, in block 516, the output of the charge sensitive amplifier 106 is greater than the output of the DAC 204, then, in block 518, the control circuitry 202 sets the index value to two, and routes the energy threshold value stored in the threshold register 212 corresponding to the index value 2 to the DAC 204. If, in block 518, the output of the charge sensitive amplifier 106 is greater than the output of the DAC 204, then the output value of the ADC 108 is set to three. In some embodiments, a number of events corresponding to an energy bin (e.g., energy bin "2") may be incremented in block 522 (e.g., a bin counter for bin 2 may be incremented). On the other hand, if, in block 518, the output of the charge sensitive amplifier 106 is less than the output of the DAC 204, then the output value of the ADC 108 is set to two. In some embodiments, a number of events corresponding to an energy bin (e.g., energy bin "1") may be incremented in block 524 (e.g., a bin counter for bin 1 may be incremented).

If, in block 516, the output of the charge sensitive amplifier 106 is less than the output of the DAC 204, then, in block 520, the control circuitry 202 sets the index value to zero, and routes the energy threshold value stored in the threshold register 212 corresponding to the index value 0 to the DAC 204. If, in block 520, the output of the charge sensitive amplifier 106 is greater than the output of the DAC 204, then the output value of the ADC 108 is set to one. In some embodiments, a number of events corresponding to an energy bin (e.g., energy bin "0") may be incremented in block 526 (e.g., a bin counter for bin 0 may be incremented). On the other hand, if, in block 520, the output of the charge sensitive amplifier 106 is less than the output of the DAC 204, then the output value of the ADC 108 is set to zero.

Discrimination between photons of different energies is one application of photon counting detectors. Thus, energy bins corresponding to different energy levels are used accumulate the number of photons detected at each energy level for each pixel. It is generally assumed that the charge generated by each photon is collected as a whole by the pixel on which the photon is incident. However, in practice this assumption is false, and the ratio of charge collected by a "pixel of incidence" to the total charge generated by the photon is a function of where the photon is incident. FIG. 6A shows photon energy incident on an array of pixels of the photon sensor 202. Photon incidence 602 straddles pixels B1 and B2, with energy 65 measured in B2 and energy 32 measured in B1. Photon incidence 604 straddles pixels B4, B5, and C4, with energy 64 measured in B4, energy 11 measured in B5, and energy 29 measured in C4. Photon incidence 606 straddles pixels D2 and D3, with energy 35 measured in D3 and energy 26 measured in D2. Photon incidence 608 is isolated to pixel E1 with energy 50.

FIG. 6B shows updating of the energy bins of the array of pixels responsive the photon energy without application of anti-charge sharing. The designations "Bin1," "Bin2," and "Bin3" identify pixel bins associated with different energy ranges. Responsive to photon incidence 602, Bin1 of pixel B1 and Bin3 of pixel B2 are incremented. Responsive to photon incidence 604, Bin3 of pixel B4 and Bin1 of pixel C4 are incremented. Responsive to photon incidence 606, Bin1 of pixel D2 and Bin2 of pixel D3 are incremented. Responsive to photon incidence 608, Bin2 of pixel E1 is incremented.

Thus, the energy bin updating of FIG. 6B fails to accurately reflect the incidence of photons of the proper energy at pixels for which the photon incidence overlaps multiple pixels. The anti-charge sharing logic 112 processes the output of the ADC 108 to determine which bins of the pixels in which charge is detected should be updated. FIG. 6C shows updating of the energy bins of the array of pixels responsive to the photon energy with application of anti-charge sharing while the ADC 108 is operating in energy threshold mode in accordance with various embodiments. While the ADC 108 is operating in energy threshold mode, the anti-charge sharing logic 112 examines the energy values generated by the ADC 108 for adjacent pixels. If the energy values indicate that one pixel received the majority of the energy from a photon incidence, then the anti-charge sharing logic 112 increments, by one, the bin counter for the appropriate energy level corresponding to the one pixel. If the energy values indicate that no pixel received the majority of the energy from a photon incidence, then the anti-charge sharing logic 112 increments, by one-half, the bin counters for the majority energy level corresponding to the each of the pixels that share the majority of the energy. Accordingly, in FIG. 6C, the majority of the energy from photon incidence 602 is associated with pixel B2, and Bin3 of pixel B2 is incremented by one. For photon incidence 604, the majority of the energy is associated with pixel B4, and Bin3 of pixel B4 is incremented by one. For photon incidence 608, all of the energy is associated with pixel E1, and Bin2 of pixel E1 is incremented by one. For photon incidence 606, the majority of the energy is shared by pixels D2 and D3, and Bin1 of each of pixels D2 and D3 is incremented by one-half. Even though a bin value is incremented by one-half, the value of the bin may be presented as a whole number.

FIG. 6D shows updating of the energy bins of the array of pixels responsive to the photon energy with application of anti-charge sharing while the ADC 108 is operating in successive approximation mode in accordance with various embodiments. While the ADC 108 is operating in successive approximation mode, the anti-charge sharing logic 112 compares the energy values generated by the ADC 108 for adjacent pixels. The anti-charge sharing logic 112 selects the pixel having the highest energy value associated with a given photon incidence as the pixel to be updated. The anti-charge sharing logic 112 sums the energies of adjacent pixels to determine which energy bin of the pixel to be updated to increment. In FIG. 6D, pixel B2 is associated with the highest energy level from photon incidence 602 and the sum of the energies from pixels B1 and B2 results in Bin4 of pixel B2 being incremented by one. For photon incidence 604, pixel B4 has the highest energy level, and the sum of the energies from pixels B4, B5, and B4 results in Bin5 of pixel B4 being incremented by one. For photon incidence 606, pixel D3 has the highest energy level, and the sum of the energies from pixels D3 and D2 results in Bin3 of pixel D3 being incremented by one. For photon incidence 608, all the energy is in pixel E1, and Bin2 of pixel E1 is incremented by one.

FIG. 7 shows a flow diagram for a method 700 for photon counting in accordance with various embodiments. Though depicted sequentially as a matter of convenience, at least some of the actions shown can be performed in a different order and/or performed in parallel. Additionally, some embodiments may perform only some of the actions shown. In some embodiments, at least some of the operations of the method 700 can be performed by the circuitry of the photon counting X-ray system 100.

In block 702, the ADC 108 is prepared for operation. The preparation includes writing values to the threshold registers 212 for use by the ADC 108 while operating in the energy threshold mode. Each value written to one of the threshold registers 212 is an energy value that defines an energy bin used to discriminate the energy of the photons detected by the photon sensor 104.

In block 704, the photon counting X-ray system 100 is operating. The X-ray source 102 is producing X-rays that pass through the object 118 and strike the photon sensor 104. The photon sensor 104 is detecting incidence of photons on the photon sensor 104, and charge generated by the photon sensor 104 is amplified by the charge sensitive amplifier 106.

In block 706, the operational mode of the ADC 108 is selected. The digitization mode for the ADC 108 of a given pixel may be selected by the frequency of photons incidence with the pixel area of the photon sensor 104 during a past time interval. For example, the processing circuitry 110 may set a frequency threshold value that defines a frequency at which the ADC 108 transitions between operation modes. If the frequency of photon detections at the given pixel, or in the area of the given pixel, exceeds the threshold, then the ADC 108 is set to operate in the energy threshold mode to provide a higher digitization rate. On the other hand, if the frequency of photon detections at, or in the area of, the given pixel falls below the threshold, then the ADC 108 is set to operate in the successive approximation mode to provide higher digitization accuracy.

In block 708, the ADC 108 is triggered to convert the voltage output of the charge sensitive amplifier to a digital value. The type of value produced is dependent on operating mode of the ADC 108. For example, if the ADC 108 is operating in the successive approximation mode, then the output of the ADC 108 is a binary number that approximates the voltage output of the charge sensitive amplifier 106 as a fraction of a reference voltage value. If the ADC 108 is operating in the energy threshold mode, then the output of the ADC 108 identifies an energy bin or range corresponding to the voltage output of the charge sensitive amplifier 106. In some embodiments, the ADC 108 is triggered by comparing the output of the charge sensitive amplifier 106 to a threshold voltage. If the output of the charge sensitive amplifier 106 exceeds the threshold voltage, then the ADC 108 is triggered and the voltage across the capacitor 116 is zeroed to allow for processing of a next photon by the pixel electronics 120.

In block 710, the processing circuitry 110 receives the output of the ADC 108 and applies anti-charge sharing to update the bin counters associated with the pixels. The anti-charge sharing logic 112 analyzes the values provided by the ADC 108 for adjacent pixels and determines which bin counters of which pixels should be updated to reflect incidence of a photon on the sensor 104. If the ADC 108 is operating in successive approximation mode, the anti-charge sharing logic 112 compares the energy values for adjacent pixels generated by the ADC 108. The anti-charge sharing logic 112 selects the pixel having the highest energy value associated with a given photon incidence as the pixel to be updated. The anti-charge sharing logic 112 sums the energies of adjacent pixels to determine which energy bin of the pixel to be updated to increment.

If the ADC 108 is operating in energy threshold mode, the anti-charge sharing logic 112 examines the energy values for adjacent pixels generated by the ADC 108. If the energy values indicate that one pixel received the majority of the energy from a photon incidence, then the anti-charge sharing logic 112 increments, by one, the bin counter for the appropriate energy level corresponding to the one pixel. If the energy values indicate that no pixel received the majority of the energy from a photon incidence, then the anti-charge sharing logic 112 increments, by one-half, the bin counters for the majority energy level corresponding to the each of the pixels that share the majority of the energy.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A photon counting system, comprising:
  a photon sensor;
  a charge sensitive amplifier (CSA) configured to convert photon energy detected by the photon sensor to voltage pulses; and
  an analog to digital converter (ADC) configured to digitize the voltage pulses generated by the CSA, the ADC comprising:
    successive approximation circuitry comprising:
      an N-bit digital-to-analog converter (DAC);
      an N-bit successive approximation register (SAR);
      a plurality of N-bit registers;
      a multiplexer configured to selectively route outputs of the SAR and outputs of the N-bit registers to the DAC for conversion to an analog signal.

2. The photon counting system of claim 1, wherein each of the N-bit registers is representative of an energy value corresponding to an energy bin of the photon counting system.

3. The photon counting system of claim 1, wherein the ADC comprises a mode selection input for reception of a signal that controls whether the multiplexer routes outputs of the SAR or the N-bit registers to the DAC.

4. The photon counting system of claim 3, further comprising mode control circuitry configured to:
  determine whether photon intensity exceeds a predetermined threshold;
  drive the mode selection input to cause the ADC to select outputs of the SAR to be input to the DAC based on photon intensity not exceeding the threshold; and
  drive the mode selection input to cause the ADC to select outputs of the N-bit registers to be input to the DAC based on photon intensity exceeding the threshold.

5. The photon counting system of claim 1, wherein the ADC comprises control circuitry configured to apply a predetermined number of bits of the SAR to select the N-bit registers to route to the DAC via the multiplexer.

6. The photon counting system of claim 1, wherein the ADC comprises control circuitry configured to assign a photon energy value to an energy bin corresponding to one of six energy bins by comparison of no more than three values stored in the N-bit registers to the photon energy.

7. The photon counting system of claim 1, further comprising anti-charge sharing circuitry configured to analyze digitized photon energy values generated by the ADC to determine to which pixel of the photon sensor to assign a photon detection event.

8. The photon counting system of claim 7, further comprising, for each pixel of the photon sensor, a plurality of counters, each counter corresponding to an energy bin, wherein the anti-charge sharing circuitry is configured to, for each pixel, analyze the digitized photon energy values of adjacent pixels to determine whether to increment a counter associated with the pixel.

9. An analog to digital converter (ADC), comprising:
  successive approximation circuitry comprising:

an N-bit digital-to-analog converter (DAC);
an N-bit successive approximation register (SAR);
a plurality (M) of N-bit registers;
a multiplexer configured to selectively route outputs of the SAR or outputs of the N-bit registers to the DAC for conversion to an analog signal.

10. The ADC of claim 9, wherein each of the N-bit registers is configured to store a value corresponding to a range of photon energies, and each successive one of the N-bit registers represents a greater value of photon energy.

11. The ADC of claim 9, further comprising:
a mode selection input; and
control circuitry coupled to the mode selection input, wherein the control circuitry is configured to control the multiplexer to select outputs of the SAR or outputs of the N-bit registers to be input to the DAC.

12. The ADC of claim 9, further comprising control circuitry configured to execute a binary search for the value stored in the N-bit registers closest to and less than an analog value input to the ADC.

13. The ADC of claim 9, further comprising control circuitry configured to apply a predetermined number of bits of the SAR to select the N-bit registers to route to the DAC via the multiplexer.

14. The ADC of claim 9, wherein N=8, M=6, and the multiplexer is configured to route one of seven eight bit registers to the DAC.

15. A method for photon counting, comprising:
detecting energy of photons incident on a photon sensor;
assigning energy values to each of a plurality of N-bit registers of an analog-to-digital converter (ADC), wherein each of the energy values corresponds to an energy bin for accumulating a photon count;
digitizing the detected energy by the ADC, wherein the digitizing comprises:
applying successive approximation to digitize the detected energy in a first mode of the ADC; and
in a second mode of the ADC:
selectively converting the energy values stored in the N-bit registers to an analog signal; and
comparing the analog signals to the detected energy to determine which of the energy values corresponds to the detected energy.

16. The method of claim 15, further comprising selecting the first mode or the second mode to digitize the detected energy at a given pixel of the photon sensor based on photon intensity measured across an area of the photon sensor proximate the given pixel.

17. The method of claim 16, further comprising:
determining whether the photon intensity exceeds a predetermined threshold;
selecting the first mode based on the photon intensity not exceeding the predetermined threshold; and
selecting the second mode based on the photon intensity exceeding the predetermined threshold.

18. The method of claim 15, further comprising applying a predetermined number of bits of a successive approximation register used to digitize the detected energy in the first mode to select the energy value to convert to an analog signal in the second mode.

19. The method of claim 15, further comprising analyzing digitized detected energy values to determine to which pixel of the photon sensor to assign a photon detection event.

20. The method of claim 19:
wherein each pixel of the photon sensor is associated with a plurality of counters, and each counter corresponds to an energy bin;
the method further comprising: for each pixel, analyzing the digitized detected energy values of adjacent pixels to determine whether to increment a counter associated with the pixel.

* * * * *